United States Patent [19]

Delahoy

[11] Patent Number: 4,616,246

[45] Date of Patent: Oct. 7, 1986

[54] ENHANCEMENT OF PHOTOCONDUCTIVITY IN PYROLYTICALLY PREPARED SEMICONDUCTORS

[75] Inventor: Alan E. Delahoy, Princeton, N.J.

[73] Assignee: Chronar Corp., Princeton, N.J.

[21] Appl. No.: 443,206

[22] Filed: Nov. 22, 1982

[51] Int. Cl.[4] ............... H01L 27/14; H01L 25/00; H01L 31/00

[52] U.S. Cl. .................................. 357/30; 136/258; 357/2; 357/58; 357/63

[58] Field of Search ............... 357/2, 30, 63, 58; 136/258

[56] References Cited

U.S. PATENT DOCUMENTS 4,459,163  7/1984  MacDiarmid et al. ............... 357/30
4,478,654  10/1984  Gau et al. .......................... 357/30

Primary Examiner—James W. Davie
Assistant Examiner—Georgia Y. Epps
Attorney, Agent, or Firm—George E. Kersey

[57] ABSTRACT

A semiconductor device with an intrinsic layer that exhibits enhanced photoconductivity by the addition of a non-incidental amount of an n-type dopant.

9 Claims, 4 Drawing Figures

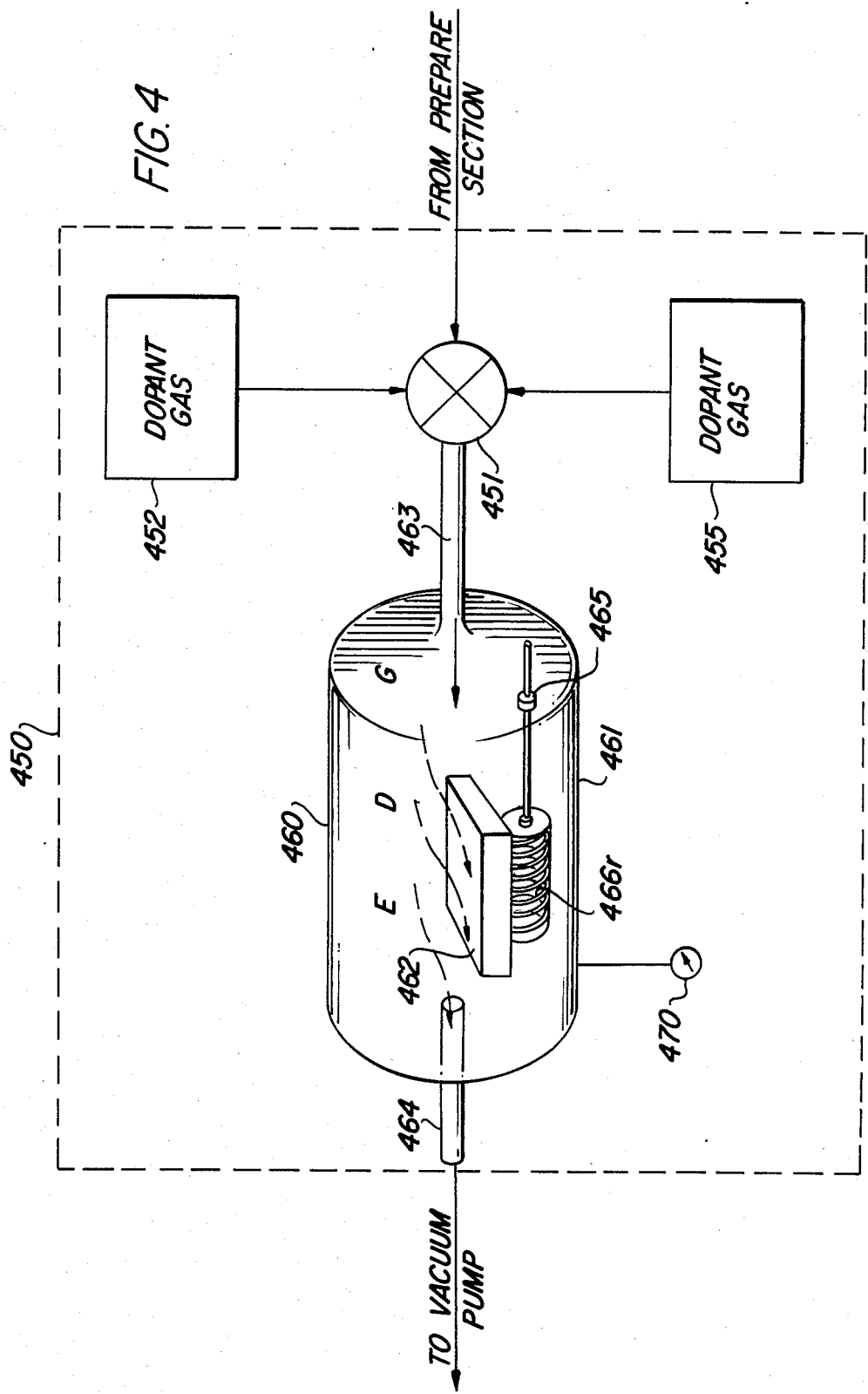

ENHANCEMENT OF PHOTOCONDUCTIVITY IN PYROLYTICALLY PREPARED SEMICONDUCTORS

BACKGROUND OF THE INVENTION

This invention relates to photoconductive semiconductors, and, more particularly, to the enhancement of photoconductivity in such semiconductors which have been prepared by the pyrolytic decomposition of one or more gaseous phase semiconductanes.

Semiconductanes are substances containing elements selected from Group IV of the Periodic Chart and thus can include germanium or tin and from Group VI, thus including selenium or tellurium. Particularly suitable semiconductanes for the production of semiconductors are the various silanes (containing silicon) and germanes (containing germanium).

There are two well established methods for producing semiconductors from semiconductanes. The first of these involves the use of a glow discharge to transform a gaseous phase semiconductane into a semiconductor. The second procedure involves the use of pyrolytic decomposition to produce the desired semiconductor.

When semiconductors have a suitable photosensitivity they can be used in photovoltaic devices such as solar cells and in devices where resistance is directly related to photoconductivity, as in the case of photodetectors.

Semiconductors produced by glow discharge are characterized by structural defects which result from the ion bombardment that is associated with the glow discharge process. As a result, it has been necessary to resort to further processing to compensate for the defects. On the other hand, amorphous silicon produced by pyrolytic decomposition, while not exhibiting the structural deficiencies associated with glow discharge, has nevertheless exhibited a lower degree of photoconductivity.

Nevertheless pyrolytically produced amorphous silicon is potentially superior to that produced by glow discharge in that the spectral response extends to longer wave lengths.

Accordingly, it is an object of the invention to enhance the photoconductivity of pyrolytically prepared semiconductors, while retaining the relatively higher long wave length quantum efficiency of such semiconductors as compared with those produced by glow discharge.

Another object of the invention is to increase the "fill factor" of pyrolytically produced solar cells. The "fill factor" of a photoresponsive solar cell is determined by the extent to which the current-voltage characteristic of the illuminated semiconductor approaches the theoretical idealized rectangular characteristic of a perfect semiconductor.

A further object of the invention is to acheive semiconductive devices, such as P-I-N photoresponsive semiconductors, in which the resultant structure exhibits enhanced photoconductivity.

SUMMARY OF THE INVENTION

In accomplishing the foregoing and related objects, the invention provides for enhancing the photoconductivity of intrinsic semiconductors prepared by pyrolytic decomposition of one or more gaseous phase semiconductanes by incorporating a controlled quantity of n-type dopant into the intrinsic semiconductor.

In accordance with one aspect of the invention, the amount of n-type dopant is less than 1,000 parts per million and is advantageously in the range from 1 part per million to 500 parts per million. A particularly suitable amount of n-type dopant is on the order of 100 parts per million.

In accordance with another aspect of the invention, the intrinsic layer which is subjected to controlled doping in accordance with the invention desirably has a thickness in the range from about 1,000 to 10,000 Angstrom units.

In accordance with a further aspect of the invention, the semiconductanes are selected from the class consisting of germanes and silanes. The n-type dopant is selected from the class including phosphorus, such as phosphine gas, and arsenic, such as arsine gas. The n-type dopant may also be selected from the class of elements which act as double donors, including sulfur and tellurium.

In accordance with yet another aspect of the invention, the controllably doped layer of intrinsic material formed by pyrolytic decomposition in the presence of an amount of n-type dopant held below the level required to produce n-type semiconductive materials, is used to produce devices with contacts on the opposite surfaces of the intrinsic layer. The contacts may be of a semiconductive material which is in turn doped to provide either n-type or p-type characteristics.

In accordance with a particular aspect of the invention, a P-I-N solar cell is produced by the pyrolytic decomposition of one or more gaseous phase silanes in the presence of a controlled amount of n-type dopant which is insufficient to convert the intrinsic material but is, nevertheless, sufficient to increase the photoconductivity of the material beyond what would exist in the absence of the n-type dopant. The desired P-I-N structure is then realized by the formation of p-type pyrolytically produced amorphous silicon on one face of the intrinsic layer, and the further production of n-type pyrolytically produced amorphous silicon on the opposite face of the intrinsic layer.

A particularly suitable thickness for the intrinsic layer lies in the range from 2,000 to 5,000 Angstrom units.

DESCRIPTION OF THE DRAWINGS

Other aspects of the invention will become apparent after considering several illustrative embodiments taken in conjunction with the drawings in which

FIG. 4 is a schematic diagram of an illustrative arrangement for producing semiconductors in accordance with the invention.

DETAILED DESCRIPTION

Figure 1:
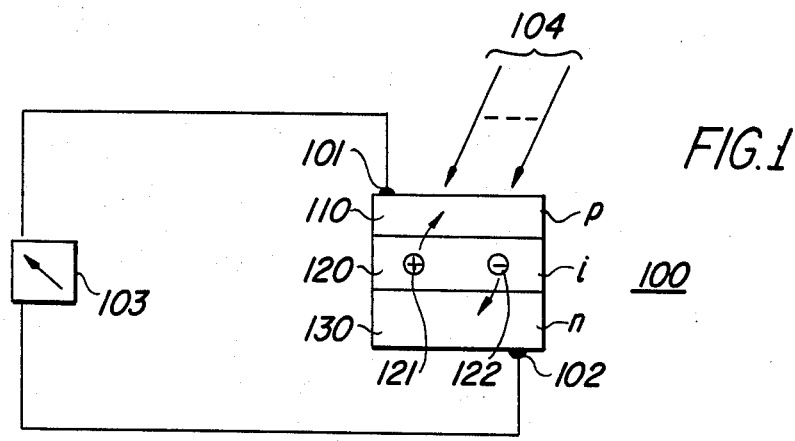
FIG. 1 is a schematic view of P-I-N solar cell which can be produced in accordance with the invention.

With reference to the drawings, FIG. 1 shows a representative P-I-N solar cell 100, which is formed by an intrinsic layer 120 of amorphous silicon and opposing layers 110 of p-type silicon and 130 of n-type silicon. Contact to the cell 100 is made by ohmic connections 101 and 102 which are illustratively included in circuit with a meter 103. When solar radiation 104 falls upon the cell 100, holes, including the illustrative hole 121, are drawn into the p-type layer 110 and electrons, including the illustrative electron 122, are drawn into the n-type layer 130. This movement of holes and electrons in response to solar activation produces current flow through the member 103. It will be appreciated that suitable resistive elements are included in order to control the amount of current flow associated with the solar activation.

Figure 2:
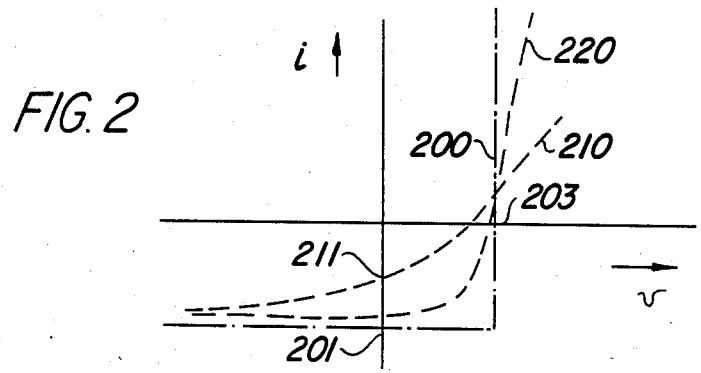
FIG. 2 is a graph of current voltage characteristics applicable to devices of the kind shown in FIG. 1.

The current voltage characteristic associated with an ideal solar cell 100 of FIG. 1 is illustrated by the rectangular curve 200 in FIG. 2. The idealized curve 200 is not physically realizable in practice but merely represents a theoretical maximum. The curve 200 applies when the cell 100 is exposed to solar radiation. The short-circuit current 201 represents the current flow in the external circuit when the terminals 101 and 102 are brought into direct contact with one another. Theoretically, current flow continues at the short-circuit level until there is infinite impedance in the external circuit at which point the voltage at terminals 101 and 102 is at the "open circuit" level 203.

In the case of a solar cell produced using pyrolytically deposited amorphous silicon the current voltage characteristic departs significantly from the idealized curve 200 and is instead represented by the alternative curve 210. The curve 210 has a reduced short circuit current 211. In addition, the portion of the characteristic in the fourth quadrant of the current voltage characteristic departs significantly from the rectangular curve 200. This departure is associated with reduced photoconductivity of the device and is primarily governed by the reduction in photoconductivity in the intrinsic layer 120 of FIG. 1 that typically occurs when the layer 120 is produced by pyrolytic decomposition.

However, when the intrinsic layer 120 of FIG. 1 is produced by a controlled amount of n-type doping, below the level at which the intrinsic character of the layer 120 is altered and the layer is instead converted to n-type material, the result is a dramatic improvement in the fill factor as illustrated by the representative curve 220 of FIG. 2. As a result of the n-type doping of the intrinsic layer the fill factor is dramatically increased from 0.41 for an intrinsic layer of 2,050 Angstrom units to 0.51 for an intrinsic layer with a thickness of 3,100 Angstrom units. This improvement in fill factor was obtained even with the increased intrinsic layer thickness which in the absence of controlled n-type doping would generally exhibit a lower fill factor. In addition, there was an insignificant reduction in the short circuit current which was 4.25 and 4.70 mAcm$^{-2}$ for unmodified intrinsic layers of 2050 and 3800 Angstrom units in thickness and 4.75 mA cm$^{-2}$ for the doped intrinsic layer.

These results are entirely contrary to what has been observed with glow discharge amorphous silicon where the addition of even minute amounts of n-type dopants (on the order of 10 parts per million) produces serious degeneration in both hole transport and short circuit current. Indeed, numerous attempts have been made to compensate for the presence of residual or contaminating n-type dopants by the deliberate addition of p-type dopants.

Without seeking to provide an absolute explanation of the phenomenum, it is nevertheless speculated that in pyrolytic decomposition the incorporation of n-type materials in intrinsic layers does not produce the same kind of chemical bonds which cause the measured deficiencies that have been noted for glow discharge materials.

The desired n-type doping of the intrinsic layer produced by pyrolytic decomposition is illustratively achieved using the reaction chamber of FIG. 4. The chamber 460 is included within the conversion section 450. The chamber 460 is bounded by an envelope 461 and illustratively contains a substrate 462 upon which intrinsic amorphous silicon is to be deposited. Selected polysilanes or a monosilane-polysilane mixture enters through a control valve 451 which allows the gaseous mixture to be supplemented by one or more n-type dopant gases from one or more sources 452 and 455. Positioned below an inlet 463 is a support for a holder 466 of the substrate 462.

Figure 3:
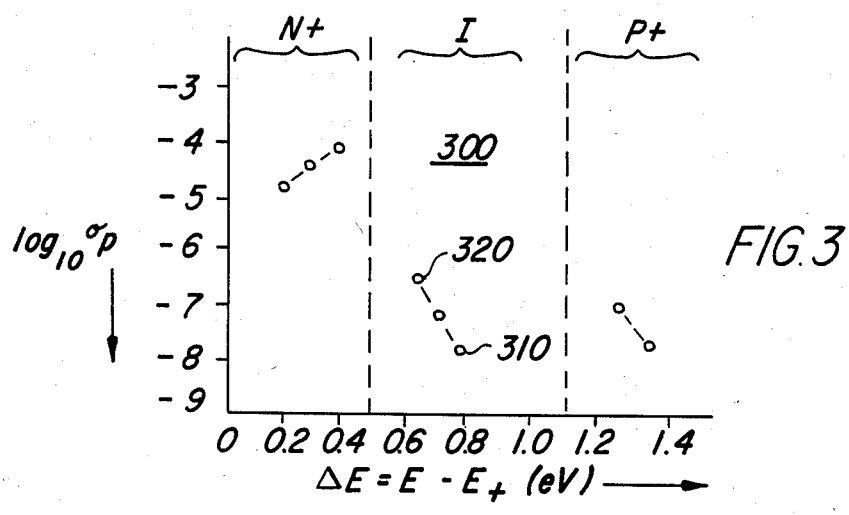
FIG. 3 is a curve of photoconductivity plotted against activation energy for various kinds of photosensitive semiconductor materials.

The effects of the invention are further illustrated by curve 300 of FIG. 3 which shows the experimentally determined values of photoconductivity $\sigma_p$*plotted against activation energy $\Delta E = E_c - E_F$. Each point represents a different pyrolytically prepared film, and the films are divided into those which might be suitable as n-layers, i-layers, or p-layers according to their Fermi level position $E_F$ with respect to the conduction band edge $E_c$. Curve 300 shows that the photoconductivity $\sigma_p$ of pyrolytically deposited a-Si:H films increased by over four orders of magnitude ($>10^4$) as the activation energe $\Delta E$ is reduced from 0.8 to 0.4 eV. In particular, by incorporating very small amounts (1-100 parts per million) of n-type dopants into the film $\Delta E$ is reduced from 0.8 to 0.6 eV, and $\sigma_p$ increased from the range $10^{-9}$ to $10^{-8}\Omega^{-1}\text{cm}^{-1}$ to the range $10^{-7}$ to $10^{-6}$ $\Omega^{-1}\text{cm}^{-1}$ thus moving from the point 310 to point 320 in FIG. 3. At this low level of dopant incorporation the higher photoconductivity is achieved without the catastrophic introduction of defects found in the case of glow discharge deposted films, while the relatively higher quantum efficiencies at lower wave lengths are maintained.

*measured at a photon flux of $8 \times 10^{14}$cm$^{-2}$s$^{-1}$ at 600 nm.

While various aspects of the invention have been set forth by the drawings and specification, it is to be understood that the foregoing detailed description is for illustration only and that various changes in parts, as well as the substitution of equivalent constituents for those shown and described may be made without departing from the spirit and scope of the invention as set forth in the appended claims.

What is claimed is:

1. In a semiconductor device comprising a first semiconductor layer of a first conductivity type, an intrinsic semiconductor layer on said first semiconductor layer, and a second semiconductor layer of a second conductivity type on said intrinsic semiconductor layer;

said intrinsic semiconductor layer being formed by the decomposition of one or more gaseous semiconductanes, which layer exhibits enhanced photoconductivity by the addition of a non-incidental amount of an n-type dopant.

2. The layer of claim 1 wherein said n-type dopant is present in an amount on the order of 100 parts per million.

3. The layer of claim 1 wherein said n-dopant is present in an amount on the order of 500 parts per million.

4. The layer of claim 1 wherein said n-type dopant is present in the range from about 500 parts per million to less than 1,000 parts per million.

5. The layer of claim 1 wherein said n-type dopant is selected from the class of phosphors, and arsenicals.

6. The layer of claim 1 wherein said n-type dopant is selected from the class of double donor element including sulfur and tellurium.

7. The layer of claim 1 formed by pyrolytic decomposition.

8. The layer of claim 1 formed into a device by the combination of a n-type contact therewith.

9. The device of claim 8 deposited on a non-conducting substrate.

* * * * *